United States Patent [19]

Mullen, III et al.

[11] Patent Number: 4,586,764

[45] Date of Patent: May 6, 1986

[54] ELECTRICAL SUBASSEMBLY STRUCTURE

[75] Inventors: William B. Mullen, III, Boca Raton; James E. Van Hout; William M. Bradford, both of Ft. Lauderdale, all of Fla.

[73] Assignee: Motorola, Inc., Schaumburg, Ill.

[21] Appl. No.: 689,116

[22] Filed: Jan. 7, 1985

[51] Int. Cl.⁴ .............................................. H05K 1/14
[52] U.S. Cl. .................................. 339/17 M; 361/414
[58] Field of Search .......... 339/17 LC, 17 LM, 17 M, 339/17 N, 17 L; 361/412, 414, 413

[56] References Cited

U.S. PATENT DOCUMENTS

| | | | |
|---|---|---|---|
| 3,609,464 | 9/1971 | Stone | 361/412 |
| 3,772,776 | 10/1973 | Weisenburger | 361/412 |
| 4,107,760 | 8/1978 | Zimmer | 361/412 |
| 4,250,536 | 2/1981 | Barringer et al. | 361/413 |
| 4,339,628 | 7/1982 | Marcantonio et al. | 361/412 |
| 4,423,920 | 1/1984 | Cooper et al. | 361/17 M |

OTHER PUBLICATIONS

IBM Bulletin, Roche, vol. 5, No. 11, p. 14, 4-1963.

*Primary Examiner*—Neil Abrams
*Attorney, Agent, or Firm*—Daniel K. Nichols; Joseph T. Downey; Edward M. Roney

[57] ABSTRACT

An electrical subassembly structure of two substrates has metalized portions located adjacent to the upper and lower edges on the back of each substrate. Clip on leads are attached to one substrate with a portion of each lead soldered to the lower edge metalized portion. The two substrates are electrically and mechanically joined by soldering upper edge metalized portions together and soldering the lower edge metalized portions of the other substrate to the lead portions.

3 Claims, 4 Drawing Figures

ELECTRICAL SUBASSEMBLY STRUCTURE

BACKGROUND OF THE INVENTION

The invention relates to electrical subassemblies in general and in particular to the mounting of electrical subassemblies to form a single structure. A well known assembly technique is to mount electrical components on individual substrates or circuit boards and then mount the individual subassembly to a mother board for interconnection with other circuits and subassemblies. A particularly advantageous type of lead for connecting a substrate to a mother board is the clip-on lead that mechanically clips to the subassembly and is soldered to maintain good electrical and mechanical connection. Such conventional leads include pins which are placed in holes in the mother board and the pins are soldered to the mother board.

In electrical devices, such as radio transmitting and/or receiving equipment, it is often necessary to provide shielding about individual subassemblies. To accomplish this, a subassembly can be placed within an individual shielded enclosure to provide the desired isolation. When mounting a plurality of such subassembly to a mother board, it will be appreciated that each subassembly must be positioned a distance from adjacent subassemblies so as to avoid electrical contact between components that are mounted on the subassemblies. Furthermore, when each subassembly includes a shield, this interposes additional spacing separation requirements between subassemblies due to the inherent sizes of such shielded subassemblies, thereby affecting the density of placement of subassemblies on a mother board.

SUMMARY OF THE INVENTION

This electrical subasssembly structure allows the placing of substrates in a back to back configuration to provide both electrical and mechanical interconnection of the substrates. The asssembled substrates can be mounted as a single unit and if desired can be mounted within a single shield, thereby allowing higher packing density of substrates on the mother board. Electrical interconnections can be made directly between the substrates thereby avoiding the necessity of making such connections through a mother board.

The electrical subassembly structure includes a first subassembly having a back side and a component carrying front side and a second subassembly having a back side and a component carrying front side. Each of the back sides have upper and lower edges with plurality of metalized portions located adjacent to the upper edges and lower edges.

A plurality of clip-on leads are connected to the lower edge of one of the subassemblies. Each of the clip-on leads has a portion positioned against the lower edge metalized portions providing both electrical and mechanical connections to said one subassembly. The other subassembly is mounted to the first subassembly with at least some of its upper edge metalized portions electrically and mechanically connected to the first subassembly upper edge metalized portions and at least some of its lower edge metalized portions electrically and mechanically connected to the first subassembly lower edge portion through the clip-on lead portions.

In one aspect of the invention, the upper edge metalized portions are soldered together. In another aspect of the invention, the clip-on lead portions are soldered to the lower edge metalized portions of the first subassembly and the lower edge metalized portions of the other subassembly are soldered to the clip-on lead portions.

In another aspect of the invention, the upper edges of the first and second subassemblies are aligned. In still another aspect of the invention, the lower edge of the other subassembly extends below the lower edge of the one subassembly.

DESCRIPTION OF THE PREFERRED EMBODIMENT

Figure 1:
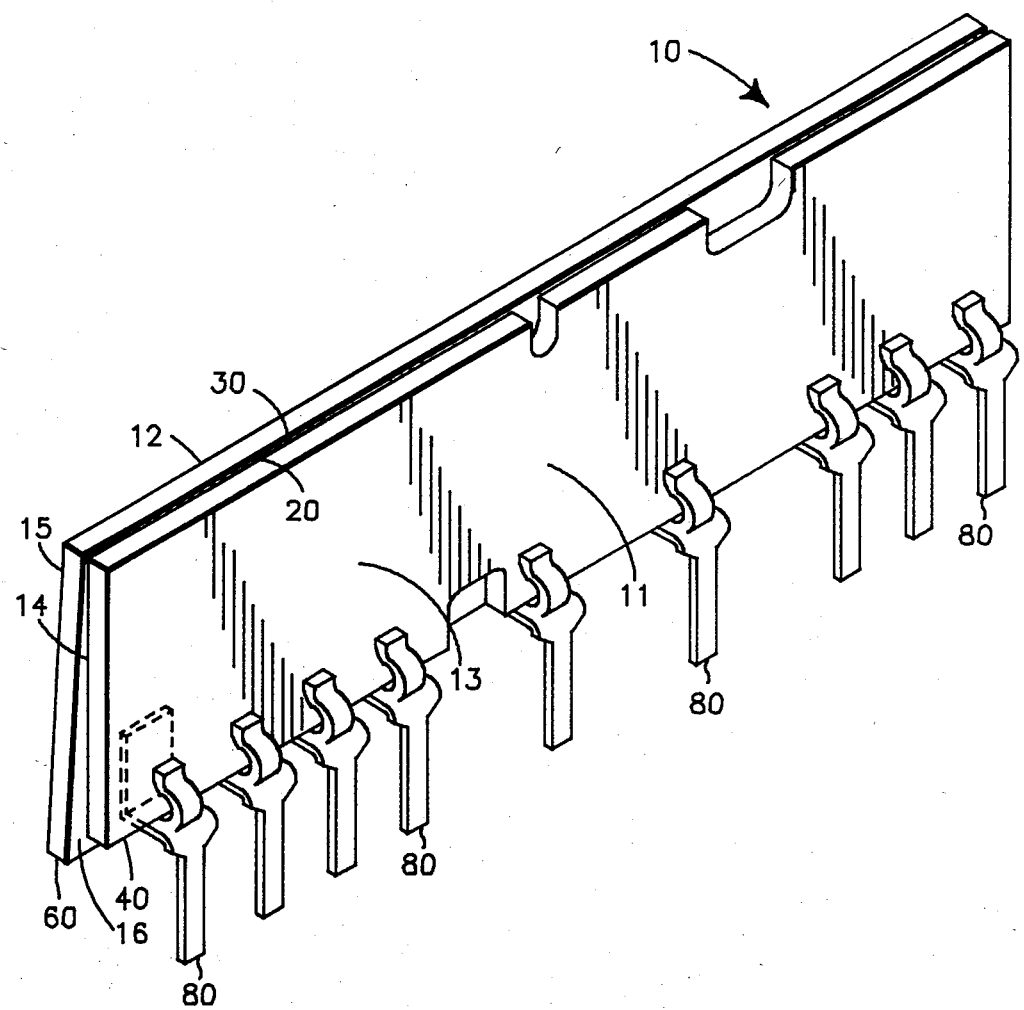
FIG. 1 is a perspective view of the electrical subassembly structure.
Figure 3:
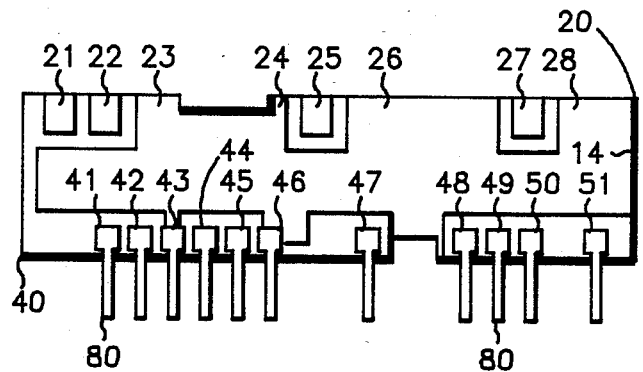
FIG. 3 is a back elevational view of one of the subassemblies.
Figure 4:
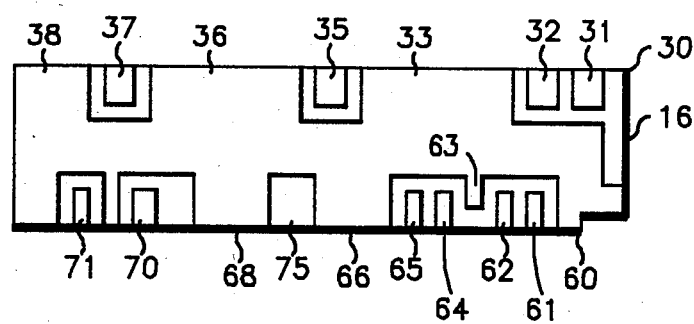
FIG. 4 is a back elevational view of the other of the subassemblies.

Referring now by characters of reference to the drawings and first to FIG. 1, it will be understood that the electrical subassembly structure 10 includes a first subassembly 11 and a second subassembly 12. The first subassembly 11 includes a front side 13 and a back side 14, which is more clearly shown in FIG. 3. The second subassembly 12 includes a front side 15 and a back side 16, which is more clearly shown in FIG. 4.

In the preferred embodiment, the first and second assemblies 11 and 12 constitute substrates and carry a plurality of innerconnected electrical components mounted to their front sides 12 and 13 as by conventional surface mount technology. For purposes of clarity the illustrations of the subassembly structure, the components and circuit traces are not shown on the drawings.

Particular circuit layouts and part placement are chosen by the circuit designer depending on the circuits to be implement. For example, one of the substrates could include an oscillator circuit while the other substrate could be a buffer stage for use in a VCO (voltage controlled oscillator) of a two-way portable radio.

The subassemblies 11 and 12 include upper edges or margins 20 and 30 respectively. A plurality of metalized portions 21-28 are located on the back side adjacent to the upper edge 20 and a plurality of metalized portions 31-38 are located on the back side adjacent to the upper edge 30. The first subassembly 11 includes a lower edge or margin 40 having a plurality of metalized portions 41-51 located on its back side 14 adjacent to the edge 40. The second set assembly 12 includes a lower edge or margin 60 with plurality of metalized portions 61-66 and 68-71 located on its backside 16 adjacent to the edge 60. A non-metalized area 75 is also located on the back side 16 adjacent to the lower edge 60.

Figure 2:
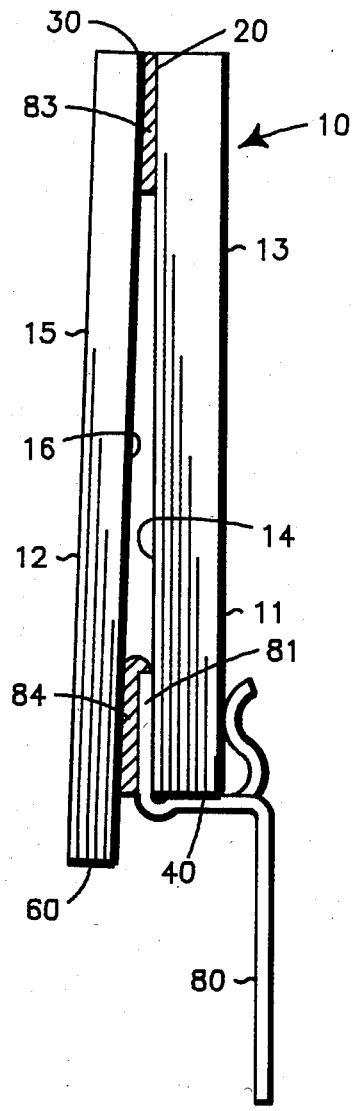
FIG. 2 is a end elevational view of the electrical subassembly structure.

The metalized areas of substrates 11 and 12 are connected to components and circuit traces as by conventional, plated through holes and via's. A plurality of clip-on leads 80 are connected to the substrate 11 at its lower edge 40. Each clip-on lead 80, as illustrated in FIGS. 1 and 2, clip about the substrate 11 in a conventional manner to provide a mechanical connection to the substrate. The clip-on leads 80 include portions 81 which are soldered to the metalized portions 41-51 to provide electrical connection to the metalized portions as well as further mechanical connection to the substrate 11.

The substrate 12 is positioned with its backside 16 against the back side 14 of substrate 11 and utilizing reflow solder techniques to solder the metalized portions 21–28 to corresponding metalized portions 31–38 by solder connections 83 and the lower edge metalized portions 61–66 and 68–71 to the portions 81 of the leads 80 by solder connections 84. The solder connections 83 and 84 providing electrical as well as mechanical interconnection of the substrates 12 and 13.

The structure 10 forms essentially an inverted "v" configuration with the upper edges 20 and 30 closely located and the back sides 14 and 16 diverging in the direction of the bottom edges 40 and 60. The divergance is due to the thickness of the clip portion 81 which is disposed between the substrates.

Ahen a circuit does not require a particular lead 80 to be electrically connected to substrate 12 a non-metalized area such as area 75 is provided so no solder connection is made at this point. When a circuit requires a lead 80 to only be electrically connection to substrate 12, its corresponding metalized area on substrate 11 is not connected to components circuit traces on the substrate.

It will be appreciated that the substrate 12 can have a greater height dimension than the substrate 11 with its lower edge 60 extending below the lower edge 40 of the substrate thereby providing additional surface area for the mounting of components.

We claim as our invention:

1. An electrical subassembly structure comprising:
    a first subassembly having a backside and a front side,
    a second subassembly having a backside and a front side,
    each of said subassemblies having an upper edge with a plurality of metallized portions located adjacent to said upper edge on its back side and a lower edge with a plurality of metallized portions located adjacent to said lower edge on its back side,
    a plurality of clip-on leads connected to the lower edge of said first subassembly, each lead having a portion positioned against lower-edge back side metallized portions for providing both electrical and mechanical connections to said first subassembly,
    the second subassembly being mounted to the first subassembly with at least some of its upper edge back side metalized portions soldered directly to said first subassemble upper-edge back side metallized portions for providing electrical and mechanical inter-connection and at least some of its lower-edge back side metallized portions soldered to said clip-on lead portions for providing electrically and mechanically connection to first subassembly lower-edge back side metallized portions through said clip-on lead portions, whereby the first and second subassemblies form an inverted "v" configuration.

2. An electrical subassembly as defined in claim 1, in which:
    the upper edges of the first and second subassemblies are substantially aligned.

3. An electrical subassembly as defined in claim 3, in which:
    the lower-edge of the second subassembly extends below the lower edge of the first subassembly for providing additional subassembly surface area.

* * * * *